(12) United States Patent
Mrozek et al.

(10) Patent No.: US 8,184,031 B1
(45) Date of Patent: May 22, 2012

(54) HIGH-ORDER WIDE BAND MODULATORS AND MULTIPLYING DIGITAL-TO-ANALOG CONVERTERS USING DISTRIBUTED WEIGHTING NETWORKS

(75) Inventors: Eric Michael Mrozek, Gardena, CA (US); Scott Lee Sing, Torrance, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 67 days.

(21) Appl. No.: 12/953,254

(22) Filed: Nov. 23, 2010

(51) Int. Cl.
*H03M 1/22* (2006.01)

(52) U.S. Cl. .................................. 341/144; 341/143

(58) Field of Classification Search .................. 341/144, 341/143, 154, 153
See application file for complete search history.

(56) References Cited

U.S. PATENT DOCUMENTS

| | | | |
|---|---|---|---|
| 3,504,360 A * | 3/1970 | Kittredge et al. ............. | 341/154 |
| 5,867,071 A | 2/1999 | Chethik | |
| 7,714,658 B1 * | 5/2010 | Striflier ......................... | 330/284 |
| 7,903,013 B2 * | 3/2011 | Yamaguchi et al. .......... | 341/144 |

OTHER PUBLICATIONS

Desrosiers, R., Hornbuckle, C., Mrozek, E., Lanphar, J., Kobayashi, K., Oki, A., Pointer, B., Monolithic 64QAM GaAs HBT Modulator, TRW Electronics & Technology Division, Redondo Beach, CA, 2002.
Larson, Lawrence E., RF and microwave circuit design for wireless communications, 1997, pp. 214-219, Artech House, Inc., Norwood, MA.
Circuit Applications of Multiplying CMOS D to A Converters, Application Note 269, National Semiconductor Corporation, Sep. 1981.
Grebene, Alan B., Bipolar and MOS analog integrated circuit design, 1984, pp. 469-474, John Wiley & Sons, Inc.
Pozar, David M., Microwave engineering, 2005, pp. 317-318, John Wiley & Sons, Inc.
Taub, Herbert, Schilling, Donald L., Digital integrated electronics, 1977, pp. 497-500, McGraw-Hill, Inc.

* cited by examiner

*Primary Examiner* — Peguy Jean Pierre
(74) *Attorney, Agent, or Firm* — John A. Miller; Miller IP Group, PLC

(57) ABSTRACT

A distributed weighting network that employs a summing line including distributed summing blocks disposed thereon. Each summing block includes a plurality of resistors that define a resistor divider network. Each summing block includes at least three ports having an input port, an output port and at least one signal port. A signal applied to each signal port of the summing blocks is modified in amplitude by the resistor divider network and summed with the signal propagating along the summing line being input to the input port and output from the output port of each summing block to provide a combined signal. The distributed weighting network can be part of a digital-to-analog converter or a QAM modulator.

20 Claims, 7 Drawing Sheets

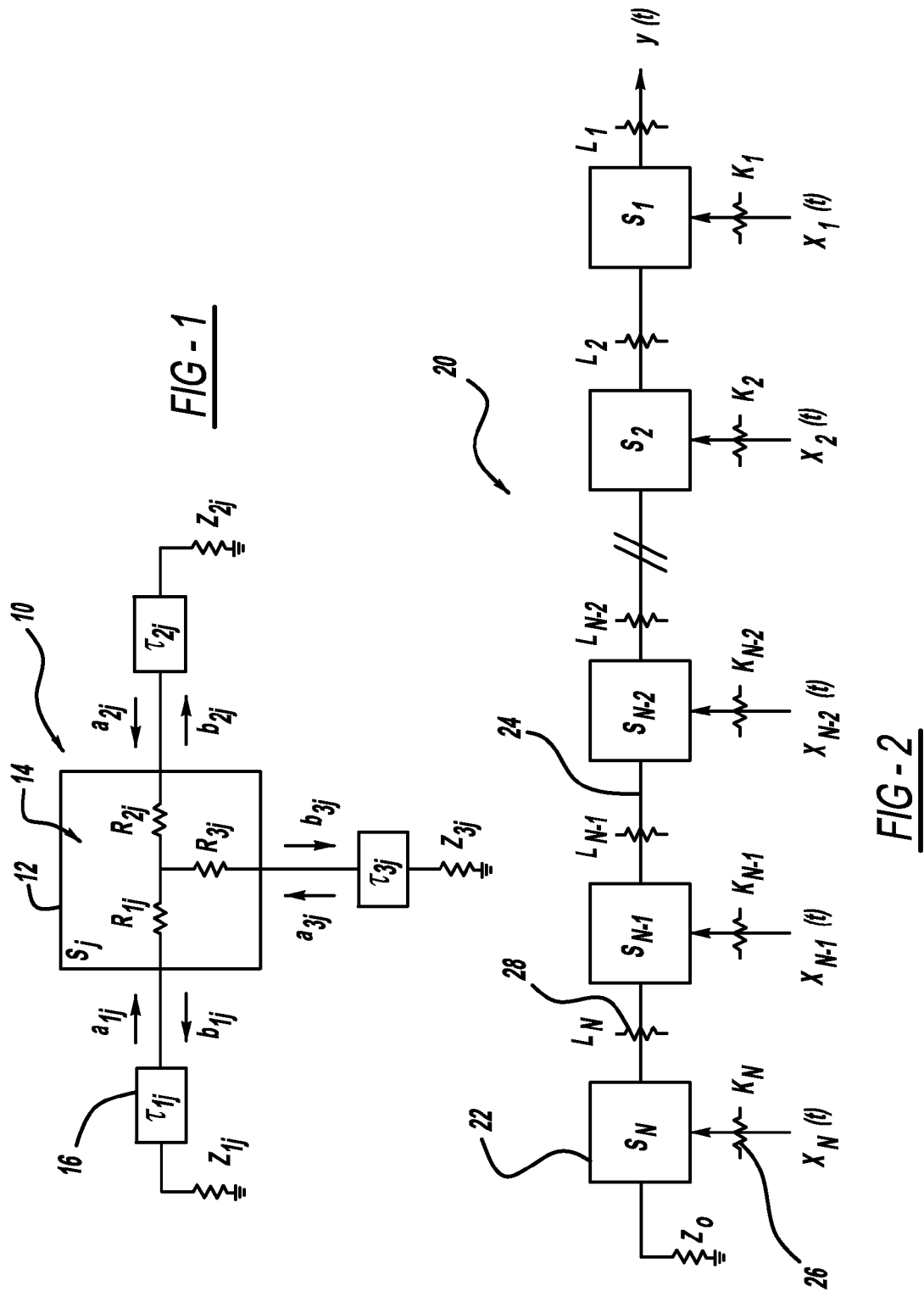

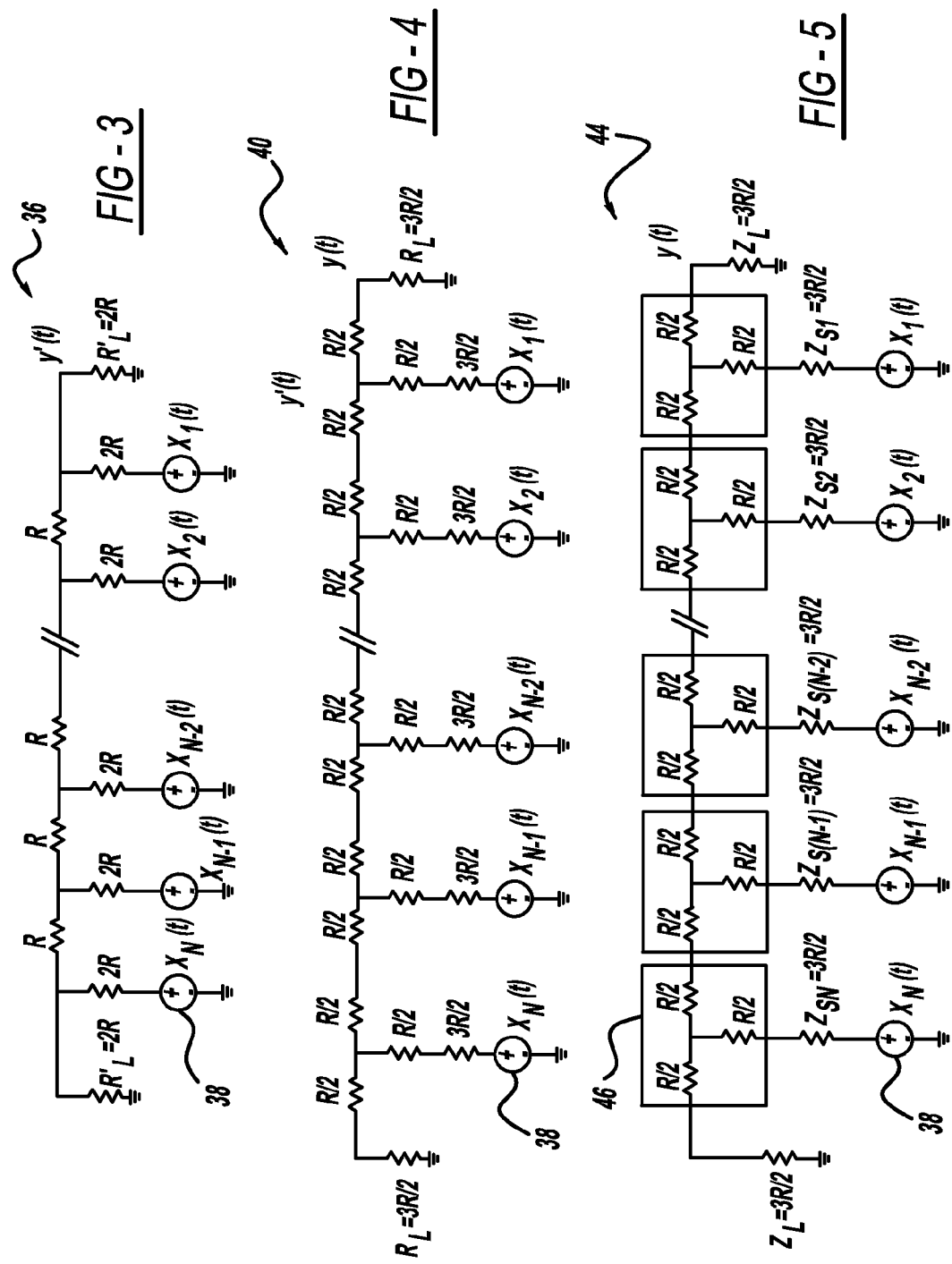

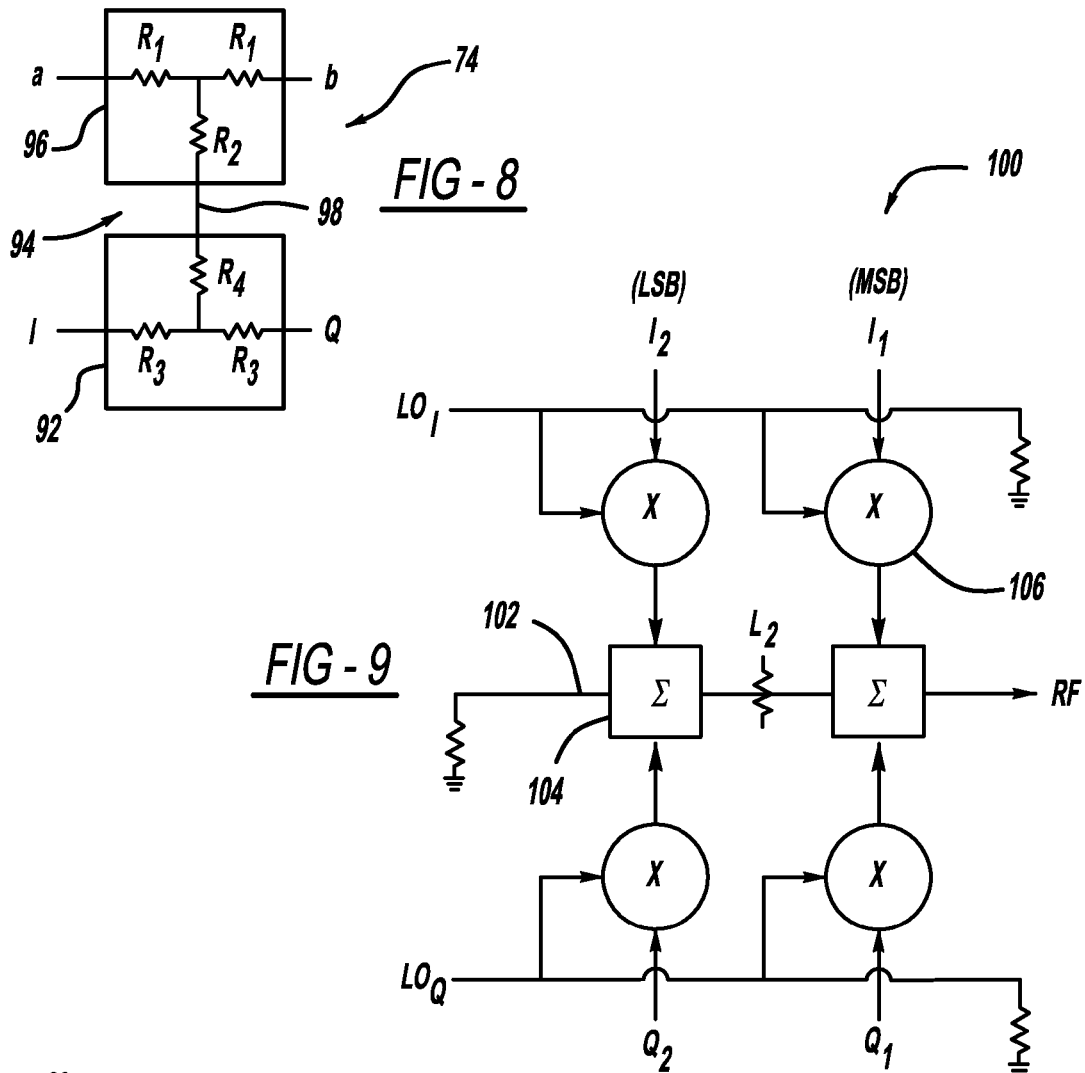
FIG - 8
FIG - 9
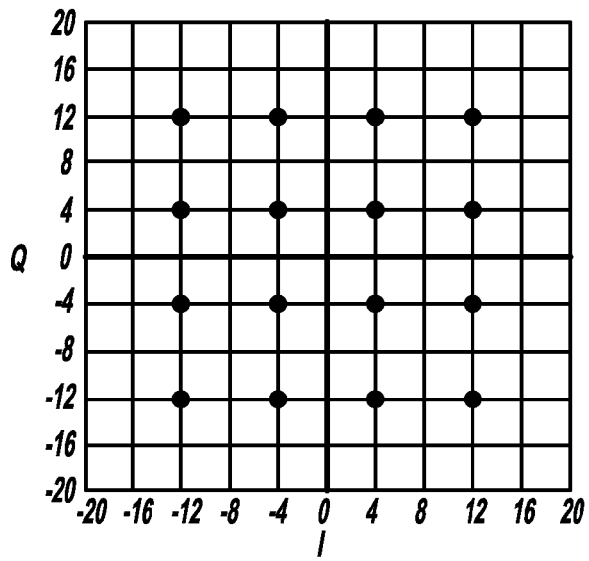
FIG - 10

HIGH-ORDER WIDE BAND MODULATORS AND MULTIPLYING DIGITAL-TO-ANALOG CONVERTERS USING DISTRIBUTED WEIGHTING NETWORKS

BACKGROUND

1. Field of the Disclosure

This disclosure relates generally to a distributed weighting network for electrical signals and, more particularly, to a high speed multiplying digital-to-analog-converter (DAC) that employs a distributed weighting network, and to a high speed, high-order wideband quadrature amplitude modulation (QAM) modulator that employs a distributed weighting network and a summing line.

2. Discussion of the Related Art

As is well understood in the art, digital modulators are used to encode data onto a carrier wave for transmission. There are many suitable modulation formats that can be employed for this purpose. One popular modulation format is known as quadrature amplitude modulation (QAM). Low-order special cases include binary phase shift keying (BPSK) and quadrature phase shift keying (QPSK). Higher-order special cases include 8PSK, 16PSK, rectangular 16QAM and 64QAM, and circular 12/4QAM.

For some data links, high-order modulation formats have been achieved at low and moderate modulation rates using DACs to generate baseband or intermediate-frequency (IF) signals, with additional up-conversion to reach the final carrier frequency for transmission. For some other data links, both a high-order modulation format and a fast modulation rate are used to provide large data throughput. Known QAM modulators of this type have sometimes been assembled from multiple monolithic microwave integrated circuits (MMICs). One need in the art is for a high speed, high-order QAM modulator for microwave carrier frequencies that can be fabricated on a single monolithic chip with a small size and low weight and a minimal need for alignment and tuning.

BRIEF DESCRIPTION OF THE DRAWINGS

FIG. 1 is a schematic diagram of a two-way resistor divider summing block;

FIG. 2 is a schematic block diagram of a distributed weighting network;

FIG. 3 is a schematic diagram of a standard R-2R resistor ladder distributed weighting network;

FIG. 4 is a schematic diagram of a modified R-2R resistor ladder distributed weighting network;

FIG. 5 is a schematic diagram of a binary-weighted matched impedance distributed summing line;

FIG. 8 is a schematic diagram of a resistor divider network employed in the summing blocks in the modulator shown in FIG. 7;

FIG. 9 is a schematic diagram of a high-order 16 QAM modulator;

FIG. 10 is a rectangular 16 QAM constellation showing the use of binary bit weighting;

DETAILED DESCRIPTION OF THE EMBODIMENTS

Figure 6:
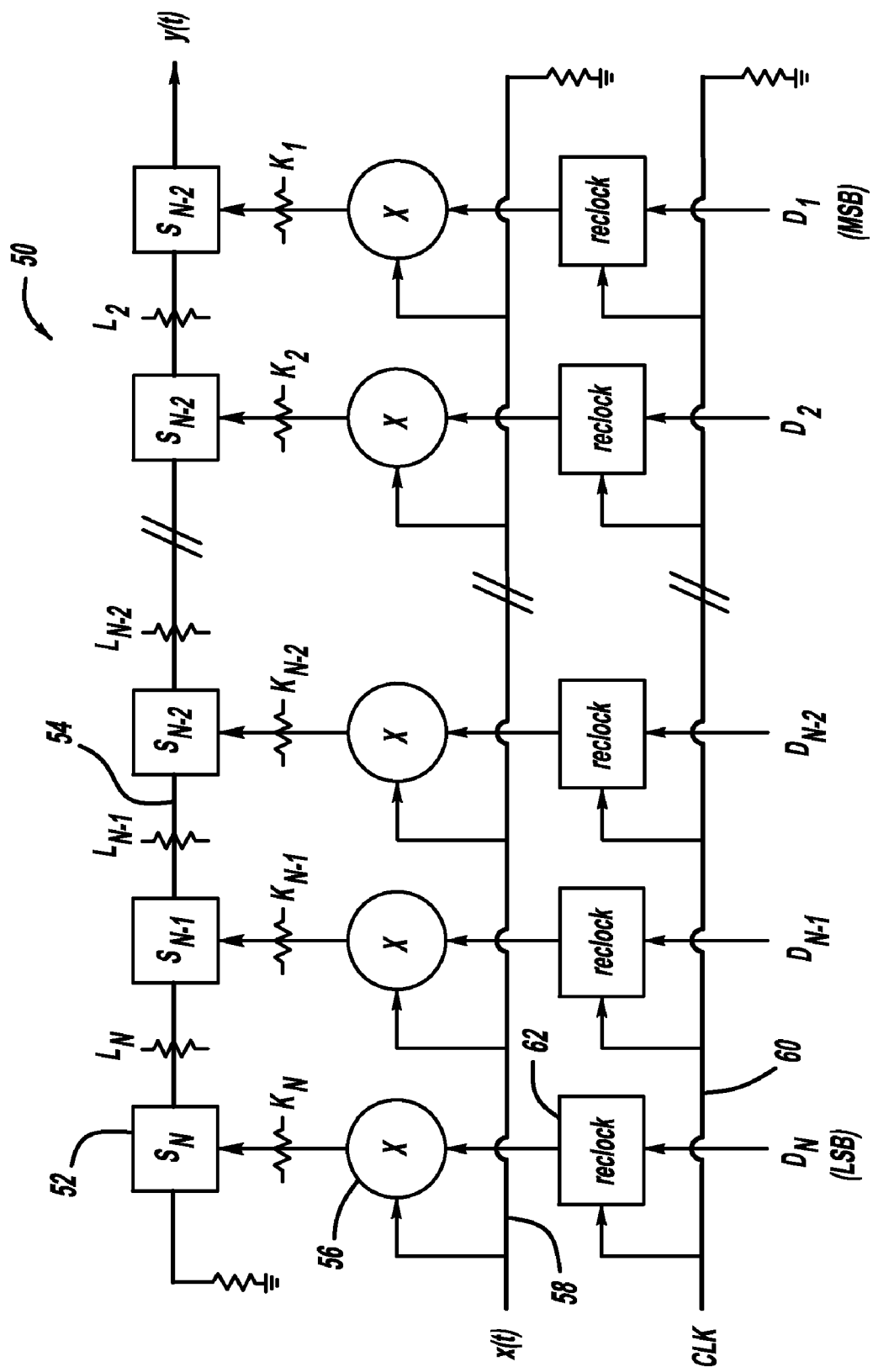
FIG. 6 is a schematic block diagram of a high speed multiplying digital-to-analog converter using signal/clock distribution lines in a distributed weighting network.

The following discussion of the embodiments of the disclosure directed to a distributed weighting network for a digital-to-analog converter or a QAM modulator is merely exemplary in nature, and is in no way intended to limit the scope of the disclosure or its applications or uses.

As will be discussed in detail below, a distributed summing/splitting network that provides arbitrary weighting factors over large bandwidths and can be fabricated on a single chip is provided. The network can achieve uniform binary weighting as a special case, and is an extension of common matched-impedance resistive power combiners/splitters. By cascading N such combiners, N input signals can be combined into a single output signal with various weighting factors. The network can also be used as a splitter to obtain N output signals with various weighting factors from a single input signal. Although there are limits as to the ultimate accuracy of the weighting, the network takes advantage of modern lithography techniques by using identical resistors.

Combining the outputs of identically designed cells with a distributed summing network is provided. This leverages the ability to fabricate well-matched components, such as sub-cells in a monolithic die, along with well-matched elements in a distributed summing line, to obtain a complex circuit with weighting factors that remain well-controlled over large bandwidths.

Combining the outputs of individual BPSK modulator cells using a distributed summing network is also provided, which results in a high-speed wide bandwidth multiplying digital-to-analog converter (MDAC).

The present disclosure also proposes combining the outputs of individual QPSK modulator cells using a distributed summing network, which results in a high-speed wide bandwidth QAM modulator. This configuration naturally has its data inputs on the periphery of the circuit, which dramatically simplifies the signal routing for planar monolithic implementations.

Distributing a reference local oscillator (LO) to individual modulator cells using a tapped transmission line that is delay matched to the distributed summing network is provided. This combination can maintain the integrity of the weighting up to microwave frequencies.

Using monotonic-direction signal routing in the physical layout of a distributed summing network to maintain the integrity of a QAM constellation over extremely wide bandwidths by controlling the phase matching of the various RF signal paths is provided.

Optionally, the use of parallel bank reclocking, one bank for I data and another bank for Q data, along with tapped transmission lines for the clock distribution lines and monotonic-direction signal routing in the physical layout of the device to achieve extremely low data skew in the complete circuit.

These techniques can also be used on board and module layouts to lower cost by minimizing the need for three-dimensional layout structures, such as RF connectors, to inject data and clock signals to the individual BPSK or QPSK sub-circuits.

FIG. 1 is a schematic diagram of a summing circuit 10 including a summing block 12. The summing block 12 can be implemented as a resistor Tee network 14 including resistors $R_1$, $R_2$ and $R_3$. The summing block 12 also includes three ports having port impedances $Z_1$, $Z_2$ and $Z_3$. Delay elements 16 may be present at each port and define delays $\tau_1$, $\tau_2$ and $\tau_3$. The summing block 12 has a weighting $w_1$, where $\frac{1}{3} w_j < 1$. When $R_{1j} = R_{2j}$, this gives the following relationships.

$$Z_{1j} = Z_0 \quad (1)$$

$$Z_{2j} = Z_0 \quad (2)$$

$$w_j \equiv \left. \frac{b_{2j}}{a_{1j}} \right|_{a_{3j}=0} \quad (3)$$

$$v_j \equiv \left. \frac{b_{2j}}{a_{3j}} \right|_{a_{1j}=0} \quad (4)$$

$$b_{2j} = a_{1j} \cdot w_j + a_{3j} \cdot v_j \quad (5)$$

$$v_j = 1 - w_j \quad (6)$$

$$Z_{3j} = \frac{Z_0}{2} \cdot \frac{1}{(1-w_j)} \quad (7)$$

$$R_{1j} = R_{2j} = Z_0 \cdot \frac{1-w_j}{1+w_j} \quad (8)$$

$$R_{3j} = \frac{Z_0}{2} \cdot \frac{3w_j - 1}{(1-w_j) \cdot (1+w_j)} \quad (9)$$

The summing block 12 provides matched impedances at all three ports $Z_1$, $Z_2$ and $Z_3$. When implemented as a thin-film resistor network 14, a valid impedance match can be obtained at high frequencies with a convenient reduction in the physical size of the circuit.

Two-way resistor dividers are commonly used to equally split signal power from one source into two loads when loss is acceptable. If all three ports of the summing block 12 have the same impedance Zo, then the three resistors $R_1$, $R_2$ and $R_3$ all have the resistance Zo/3, and the voltage transfer function from any one port to either of the other two ports is ½. If this configuration is used for all of the summing blocks 22 in a distributed summing line 20 as shown in FIG. 2, then input signals $x_j(t)$ are naturally combined with the binary weighting at an output signal y(t). This effect can be used as the basis of a digital-to-analog converter (FIG. 6) or a QAM modulator (FIG. 7).

The resistor values of the resistor divider network 14 can also be used to predistort the constellation of a QAM modulator. The expressions for achieving a particular weighting factor are given by equations (1)-(9). For the remainder of this discussion, $R_1$ and $R_2$ are presumed to be equal, and ports 1 and 2 are matched to the same impedance Zo. For port 3, the impedance $Z_3$ and the insertion loss v to and from ports 2 and 3 are functions of an insertion loss w between ports 1 and 2.

Although resistors are used in the summing blocks discussed herein, other embodiments may use other components, such as capacitors or Wilkinson combiners.

FIG. 2 is a schematic block diagram of a distributed weighting network 20. The network 20 is a series-connected set of two-way power dividers or summing blocks 22 distributed along a transmission line 24 that combine multiple input signals $x_j(t)$ into a single output signal y(t). All of the elements of the network 20 can be fabricated on a single chip. The summing blocks 22 include the resistor divider network 14, as discussed above. In some applications, the distributed weighting network 20 is referred to as a summing line, but it can also be used in the reverse direction as a splitter. The weighting network 20 may also include optional attenuators 26 in each branch that control the relative weighting of the signals $x_j(t)$ and optional attenuators 28 between the summing blocks 22 that control the relative weighting $w_j$ of sets of signals. All of the attenuators 26 and 28 may also incorporate loss-less or lossy impedance-matching between the summing blocks 22. At RF frequencies, it is desirable to match the port impedance of the various blocks 22 to avoid signal reflections that degrade the output signal y(t).

The signals $x_j(t)$ are applied to port 3 of the summing blocks 22, where the impedance of all of the ports of the summing blocks 22 would be the same. In a basic distributed weighting network, each of the resistors $R_1$, $R_2$ and $R_3$ are ⅓ of the port impedance, and would convert the signals $x_j(t)$ to a certain amplitude. If all of the summing blocks 22 are the same, then the distributed weighting network 20 operates as a digital-to-analog converter where the input bits would be the signals $x_j(t)$ applied to port 3 of the summing block 22, and the summed signals would be the analog conversion of the digital bits. In each summing block 22, the value of the resistors $R_1$, $R_2$ and $R_3$ provides the weighting factor $w_j$ for that block. Thus, the signals $x_j(t)$ applied to port 3 of the summing blocks 22 get modulated onto a carrier wave that is output as the signal y(t), and is defined by the following equation.

$$y(t) = \sum_{j=1}^{N} \left( \prod_{j+1,k=1}^{j-1} w_k \cdot L_k \right) \cdot L_j \cdot v_j \cdot K_j \cdot x_j(t) \quad (10)$$

The distributed weighting network 20 is also scalable to an arbitrary number of the input signals $x_j(t)$ by inserting additional sections to the left side of the network 20. For binary weighting and DAC applications, this is equivalent to adding least significant bits (LSBs) to obtain higher resolution. There are, however, practical limitations on the final accuracy and precision of any given implementation.

The load resistor $Z_0$ on the left side of the network 20 terminates the unused backward wave. A duplicate signal $x_N(t)$ may be used instead of a load resistor. For binary weighted configurations, this feature can be used to set the output signal y(t) to a mid-point.

The network 20 is distributed because the matched impedances allow for transmission lines of arbitrary length to be used for interconnecting summing blocks without degrading the output signal due to internal signal reflections. Thus, the distributed weighting network 20 can be used at RF and microwave frequencies to overcome a known weakness of the common R-2R ladder.

FIGS. 3-5 show that an R-2R ladder is equivalent to a special case of the distributed summing network 20. FIG. 3 shows a common R-2R ladder 36 including resistors R and 2R where the signal/data inputs are ideal voltage sources 38.

FIG. 4 shows an R-2R ladder 40 where the 2R resistors are partitioned into two resistors in series with values R/2 and 3R/2, and the R resistors are partitioned into two R/2 resistors. By incorporating each 3R/2 resistor as a source impedance, along with a minor modification in the location of the output signal, the R-2R ladder 40 is equivalent to a binary weighted distributed summing line with no transmission lines. FIG. 5 is equivalent to FIG. 4, but explicitly shows the resistor grouping for the summing blocks 46 of the distributed summing line.

Figure 7:
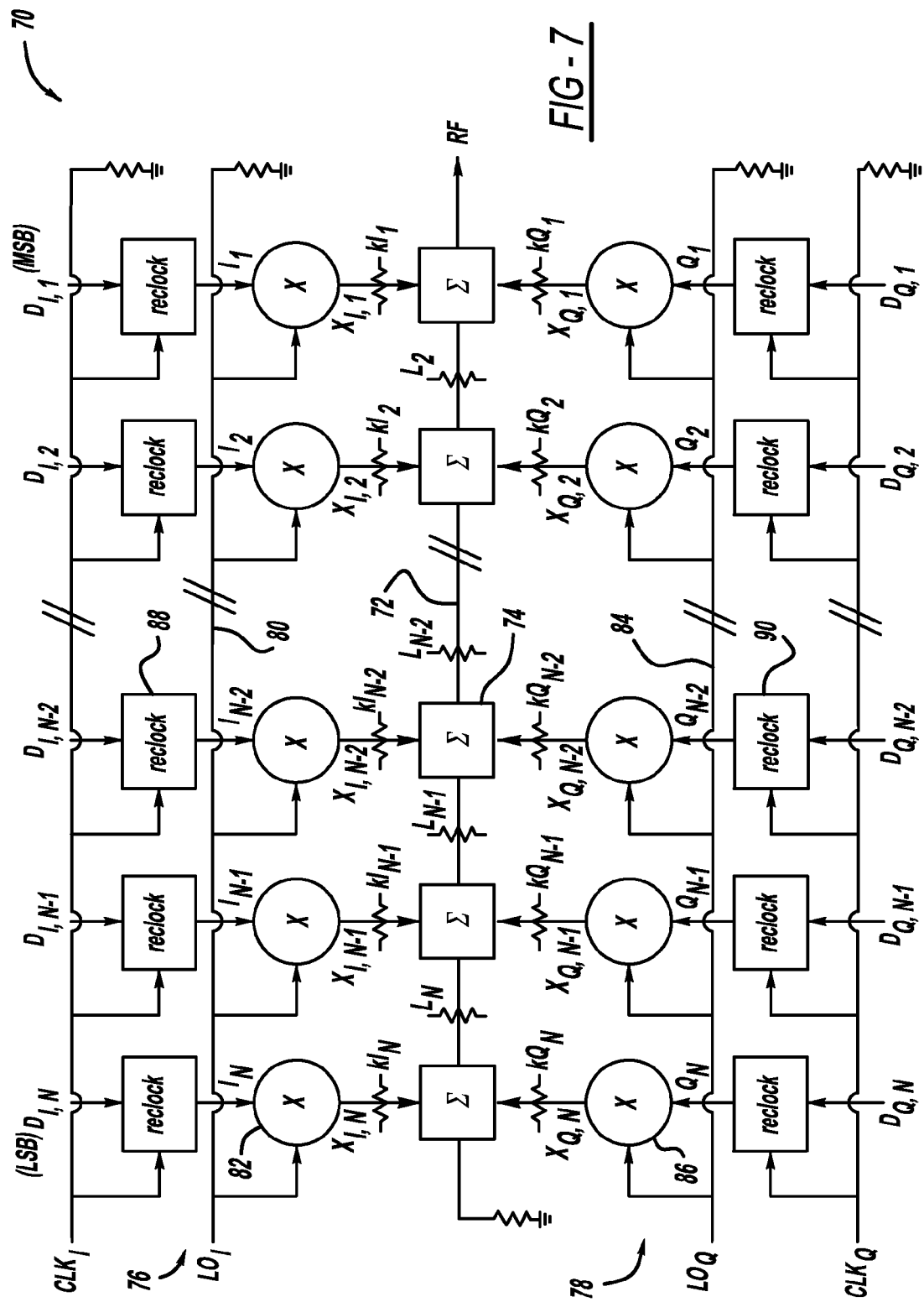
FIG. 7 is a schematic block diagram of a high-order QAM modulator using dual local oscillator (LO) and clock distribution lines and an in-phase/quadrature phase distributed summing line.

FIG. 6 is a schematic block diagram of a multiplying digital-to-analog converter (MDAC) 50 that is based on the distributed weighting network 20. The MDAC 50 includes summing blocks 52 distributed along a transmission line 54 and BPSK modulators 56 at port 3 of the summing blocks 52. Each of the summing blocks 52 defines a stage or cell of the MDAC 50, and each modulator 56 defines a binary phase shift keying (BPSK) modulator cell. A signal x(t) is applied to a signal line 58 and each of the modulators 56. Further, a clock signal CLK is applied to a clock line 60 and a reclocking circuit 62 in each summing stage of the MDAC 50 and a digital signal or bit D is applied to each reclocking circuit 60. The bits D are clocked into the MDAC 50 where they are multiplied with the signal x(t) in the modulators 56 so that the multiplied signal is amplitude controlled in the summing blocks 52. Therefore, depending on whether the digital bits D are a 1 bit or a 0 bit, or a 1 bit or a −1 bit, will depend on whether they are passed into the summing line 54 or not and how they are summed in the summing blocks 52.

The optional analog input signal x(t) on the signal line 58 and the BPSK modulator cells provides the multiplying effect. Each digital bit D is assigned to one BPSK modulator cell and the distributed summing line 54 takes care of the combining and signal weighting. One key advantage of using identical modulator stages is that identical circuits/layouts can be used to obtain highly matched performance.

At microwave frequencies, it is necessary to account for signal propagation delay on the various transmission lines. The MDAC 50 has thicker weight lines 54, 58, and 60 to indicate the transmission lines that are significant to RF performance. For the purposes of this description, it is assumed that the thin lines are either negligibly short or are parallel paths that are electrically identical.

When the propagation velocity of the signal line 58 is matched to the distributed summing line 54, then simple geometry can be used to ensure that every path that the signal takes, i.e., through any of the various BPSK modulators 56, has the same total propagation delay from the input signal x(t) to the output signal y(t). When the propagation velocities are not the same on the various transmission lines, then other techniques may be necessary to obtain the desired level of delay-matching, such as the line with the fast velocity could be meandered. Matched electrical lengths and parallel transmission lines cause the group delay from the input signal x(t) to the combined output signal y(t) to be independent of the specific signal path.

The data reclocking circuit 62 shows that the same delay matching concepts can be applied to clock distribution to obtain low data skew for the output signal y(t). Data buss reclocking with clock propagation in the same direction as the input signal x(t) achieves zero data skew at the output signal y(t).

For QAM modulator applications, it is desirable to separately amplitude modulate in-phase and quadrature-phase LO signals, and combine the result. It is possible to use two MDACs, one for the in-phase component I and one for the quadrature-phase component Q as amplitude modulators and combine these two MDAC outputs to obtain the final modulator RF output signal. However, for monolithic implementations, it is preferred to combine pairs of similar weighted I and Q signals with a resistive Tee network before injection into a single summing line.

FIG. 7 is a block diagram of a high-order QAM modulator 70 that uses a single distributed summing line 72 including summing blocks 74. One side 76 of the modulator 70 receives in-phase signals I and the other side 78 of the modulator 70 receives quadrature phase signals Q. In this embodiment, an in-phase local oscillator signal $LO_I$ is applied to transmission lines 80 and multipliers 82 on the in-phase side 76 and a quadrature phase local oscillator signal $LO_Q$ is applied to a transmission line 84 and multipliers 86 on the quadrature phase side 78. Likewise, an in-phase clock signal $CLK_I$ and in-phase data signals $D_I$ are applied to optional reclocking circuits 88 on the in-phase side 76 of the modulator 70, and a quadrature phase clock signal $CLK_Q$ and quadrature phase signals $D_Q$ are applied to optional reclocking circuits 90 on the quadrature phase side 78 of the modulator 70. The in-phase signals $X_I$ from the multipliers 82 are applied to one port of the summing blocks 74 and the quadrature phase signals $X_Q$ from the multipliers 86 are applied to another port of the summing blocks 74.

FIG. 8 is a schematic diagram of one implementation of the summing blocks 74 that includes six resistors $R_1$ and $R_2$ configured in a power divider network 94 to provide the IQ combining and bit-pair weighting in a single network. In this embodiment of summing block 74, ports a and b are equivalent in function to ports 1 and 2 of the summing block 10 in FIG. 1. An IQ combiner 92 in the network 94 may be independent of a corresponding summing block 96, but it is preferred to make them symmetric (i.e. $R_1=R_3$ and $R_2=R_4$) to avoid extra loss from the impedance matching network that would otherwise be required. When the IQ combiners 92 are co-located with the summing block 96, no additional port interconnect 98 is needed, and it is not necessary to know the actual impedance of that transmission line. Thus, the in-phase signals I and the quadrature phase signals Q are combined in the summing block 74 and added together along the summing line 72. The binary weighting (w=½) and arbitrary weighting (⅓≦w≦1) values of the resistors $R_1$ and $R_2$ are given below in equations 11-14.

$$R_1 = Z_o/3 \tag{11}$$

$$R_2 = Z_o/3 \tag{12}$$

$$R_1 = Z_o*(1-w)/(1+w) \tag{13}$$

$$R_2 = Z_o*\tfrac{1}{2}(3w-1)/(1-w)(1+w) \tag{14}$$

Other advantages of the topology of the QAM modulator in FIG. 7 include that it pushes the natural data inputs to the circuit located at the periphery of the diagram. This simplifies data routing and interfacing, especially for planar monolithic implementations. Further, there is only one on/off-chip quadrature split on the reference LO signal. Thus, it would be relatively inexpensive to tune or otherwise control the quadrature balance of the two LO signals. And data buss reclocking eliminates the need to provide separate clock signals for every data bit, even for high-speed applications. Thus, only two clock signals are needed instead of 2N clock signals.

FIG. 9 is a schematic block diagram of a 16 QAM modulator 100 including a summing line 102 having summing blocks 104 and multipliers 106 of the type shown in FIG. 7. For a 16 QAM modulator, there will only need to be two IQ stages to provide the 16 total states. Two bits each are used for the in-phase signals I and the quadrature phase signals Q or $2^4=16$ total states. Although an attenuator $L_2$ is shown between the summing boxes 104, for a standard rectangular 16 QAM modulator, the attenuator $L_2$ is set to 0 dB. The summing line 102 naturally implements binary weighting so no extra attenuators are used.

The 16 states are equally spaced on a 4-by-4 grid as shown in the constellation of FIG. 10. The signal space of this constellation is defined as:

$$\frac{RF}{LO} = K_0 \cdot \sum_{k=1}^{N} 2^{-k}(I_k + jQ_k) \quad (15)$$

Where, $I_k, Q_k \in \{+1,-1\}$, N=2, $K_0$=16.

Figure 11:
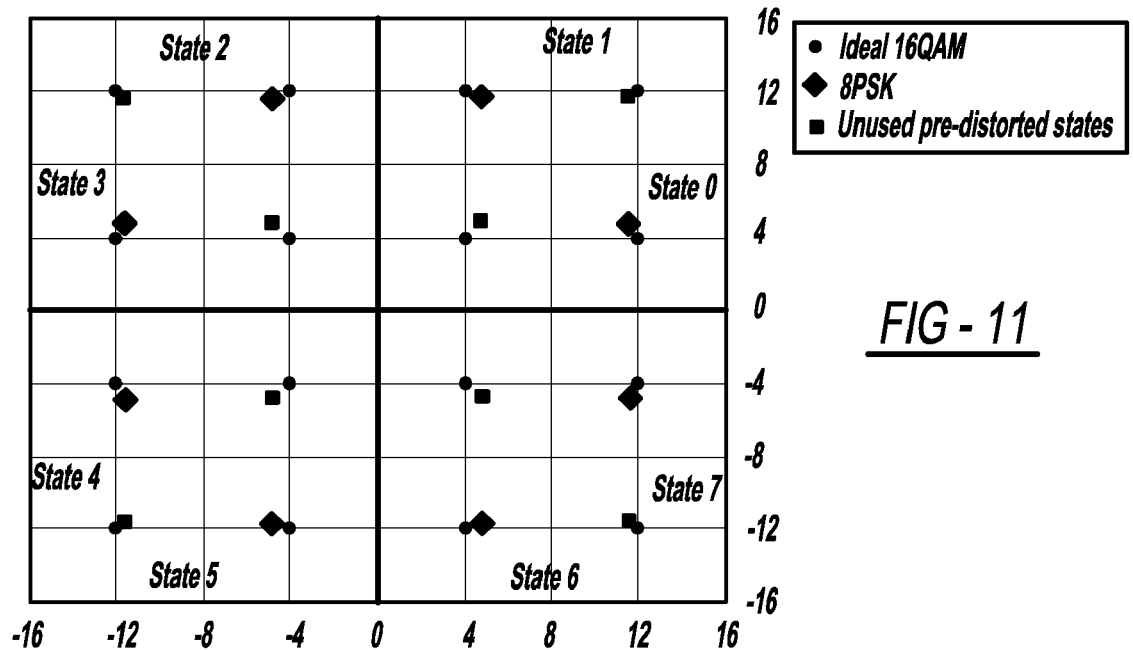
FIG. 11 is an 8 PSK constellation for a predistorted 16 QAM modulator showing the use of non-binary bit weighting.

FIG. 11 shows an 8 PSK modulator constellation obtained from a predistorted 16 QAM modulator. The predistorted 16 QAM modulator would be the same as the modulator 100 shown in FIG. 9, but with an attenuator value for the attenuator $L_2$ given in equation (16) below. Again the modulator has 16 states, but with bit-mapping, only the 8 states in the middle amplitude ring are used. Due to quadrant symmetry, those 8 states have the same amplitude. With proper bit weighting, the phases are pre-distorted to be all equally spaced in phase in 45° increments. A data mapping Table for this 8PSK constellation is given below.

$$L_2 = 2\frac{\cos\varphi - \sin\varphi}{\cos\varphi + \sin\varphi} \xrightarrow{\varphi=22.5°} L_2 = -1.63 \text{ dB} \quad (16)$$

The signal space of the constellation can be defined as:

$$\frac{RF}{LO} = K_0 \cdot \sum_{k=1}^{n} K_k(I_k + jQ_k) \quad (17)$$

Where, $I_k, Q_k \in \{+1,-1\}$, N=2, $K_0=\sqrt{10}$;
$k_1=\frac{1}{2}$, $k_2=\frac{1}{4} \cdot 2 \cdot (\cos\phi - \sin\phi)/(\cos\phi + \sin\phi)$; and
$\phi=22.5°$.

Figure 12:
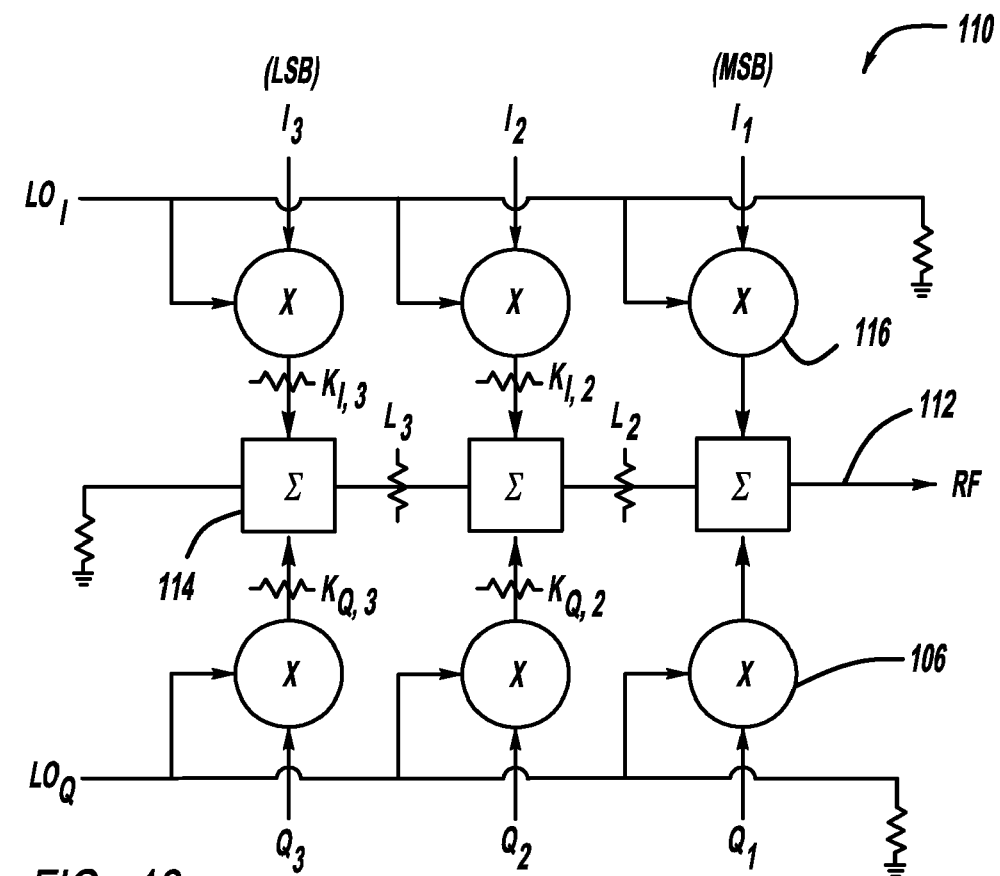
FIG. 12 is a schematic diagram of a 12/4 QAM modulator.

FIG. 12 is a schematic block diagram of a 64 QAM modulator 110 that can be predistorted to obtain circular 12/4 QAM. Multipliers 116 on the in-phase side receive the in-phase signals I and an in-phase local oscillator signal $LO_I$, and multipliers 118 on the quadrature phase side receive quadrature phase signals Q and local oscillator signals $LO_Q$. Attenuators $K_{I,3}$ and $K_{I,2}$ are provided on the in-phase side between the multipliers 116 and the summing blocks 112 and attenuators $K_{Q,3}$ and $K_{Q,2}$ are provided on the quadrature phase side between the multipliers 118 and the summing blocks 112. Attenuators $L_2$ and $L_3$ are provided in the summing line 112 between the summing blocks 114, as shown.

Figure 13:
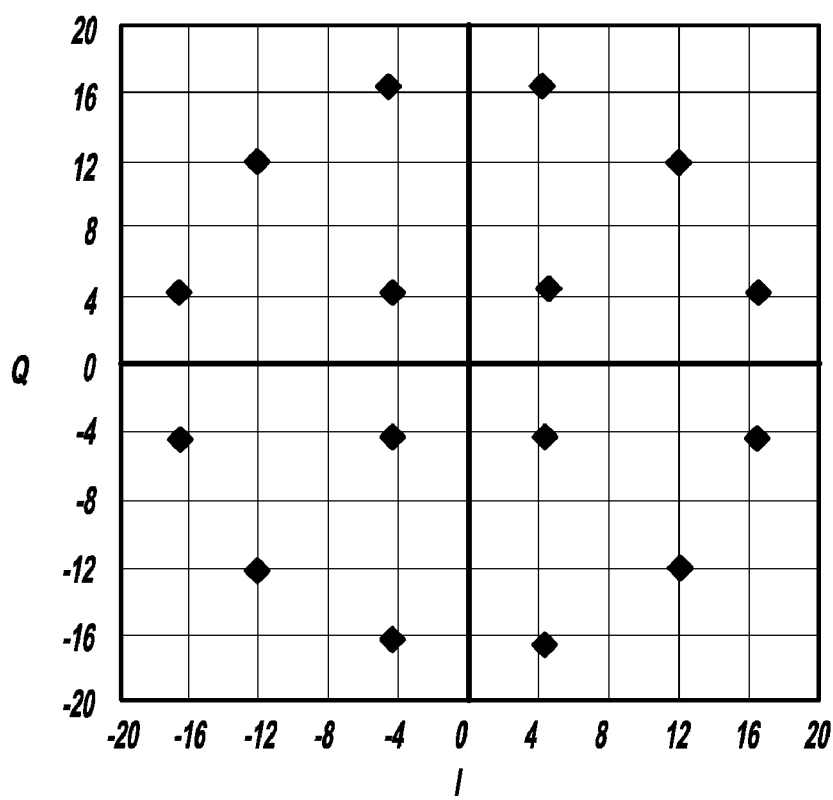
FIG. 13 is a circular 12/4 QAM constellation showing the use of non-binary bit weighting.

FIG. 13 shows a circular 12/4 QAM constellation using a subset of a 64 QAM constellation. Again, with proper bit mapping and weighting, it is possible to predistort the locations of the constellation points to achieve the desired amplitudes and phases. A data mapping Table for a 12/4 QAM from a 64 QAM modulator is given below. For the 12/4 QAM modulator 110, the values of the attenuators $L_2$, $L_3$, $K_{I,2}$, $K_{I,3}$, $K_{Q,2}$ and $K_{Q,3}$ can be:

$$L_2 = -1.46 \text{ dB} \quad (18)$$

$$K_{I,2} = K_{Q,2} = -1.25 \text{ dB} \quad (19)$$

$$L_3 = K_{I,3} = K_{Q,3} = 0 \text{ dB} \quad (20)$$

Alternately, the values of the attenuators $L_2$, $L_3$, $K_{I,2}$, $K_{I,3}$, $K_{Q,2}$ and $K_{Q,3}$ can be:

$$L_2 = L_3 = 0 \text{ dB} \quad (21)$$

$$K_{I,2} = K_{Q,2} = -2.71 \text{ dB} \quad (22)$$

$$K_{I,3} = K_{Q,3} = -1.46 \text{ dB} \quad (23)$$

The signal space of the constellation can be defined as:

$$\frac{RF}{LO} = K_0 \cdot \sum_{k=1}^{N} K_k(I_k + jQ_k) \quad (24)$$

Where, $I_k, Q_k \in \{+1,-1\}$, N=3, $K_0$=1;
$(K_1, K_2, K_3) = (10+2d, 4-d, 2+d)$; and
d=0.196125.

Data Mapping Table for 8PSK from 16QAM

| | Phase | Source Data | | | Mapped Signals | | | |
|---|---|---|---|---|---|---|---|---|
| State | (deg) | D1 | D2 | D3 | I1 | I2 | Q1 | Q2 |
| 0 | 22.5 | 0 | 0 | 0 | +1 | +1 | +1 | −1 |
| 1 | 67.5 | 0 | 0 | 1 | +1 | −1 | +1 | +1 |
| 2 | 112.5 | 0 | 1 | 0 | −1 | +1 | +1 | +1 |
| 3 | 157.5 | 0 | 1 | 1 | −1 | −1 | +1 | −1 |
| 4 | 202.5 | 1 | 0 | 0 | −1 | −1 | −1 | +1 |
| 5 | 247.5 | 1 | 0 | 1 | −1 | +1 | −1 | −1 |
| 6 | 292.5 | 1 | 1 | 0 | +1 | −1 | −1 | −1 |
| 7 | 337.5 | 1 | 1 | 1 | +1 | +1 | −1 | +1 |

Data Mapping Table for 12/4QAM from 64QAM

| | | Phase | Source Data | | | | Mapped Signals | | | | | |
|---|---|---|---|---|---|---|---|---|---|---|---|---|
| State | Mag. | (deg) | I1' | I2' | Q1' | Q2' | I1 | I2 | I3 | Q1 | Q2 | Q3 |
| 0 | 16.97 | 45 | +1 | +1 | +1 | +1 | +1 | +1 | −1 | +1 | +1 | −1 |
| 1 | 16.97 | 75 | +1 | −1 | +1 | +1 | +1 | −1 | −1 | +1 | +1 | +1 |
| 2 | 6.21 | 45 | +1 | −1 | +1 | −1 | +1 | −1 | −1 | +1 | −1 | −1 |
| 3 | 16.97 | 15 | +1 | +1 | +1 | −1 | +1 | +1 | +1 | +1 | −1 | −1 |
| 4 | 16.97 | 105 | −1 | +1 | +1 | +1 | −1 | +1 | +1 | +1 | +1 | +1 |
| 5 | 16.97 | 135 | −1 | −1 | +1 | +1 | −1 | −1 | +1 | +1 | +1 | −1 |
| 6 | 16.97 | 165 | −1 | −1 | +1 | −1 | −1 | −1 | −1 | +1 | −1 | −1 |
| 7 | 6.21 | 135 | −1 | +1 | +1 | −1 | −1 | +1 | +1 | +1 | −1 | +1 |
| 8 | 6.21 | −135 | −1 | +1 | −1 | +1 | −1 | +1 | +1 | −1 | +1 | +1 |
| 9 | 16.97 | −165 | −1 | −1 | −1 | −1 | −1 | −1 | −1 | −1 | +1 | +1 |
| 10 | 16.97 | −135 | −1 | −1 | −1 | −1 | −1 | −1 | +1 | −1 | −1 | +1 |
| 11 | 16.97 | −105 | −1 | +1 | −1 | −1 | −1 | +1 | +1 | −1 | −1 | −1 |
| 12 | 16.97 | −15 | +1 | +1 | −1 | −1 | +1 | +1 | −1 | −1 | +1 | −1 |
| 13 | 6.21 | −45 | +1 | −1 | −1 | −1 | +1 | −1 | −1 | −1 | +1 | +1 |
| 14 | 16.97 | −75 | +1 | −1 | −1 | −1 | +1 | −1 | −1 | −1 | −1 | −1 |
| 15 | 16.97 | −45 | +1 | +1 | −1 | −1 | +1 | +1 | −1 | −1 | −1 | +1 |

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A distributed weighting network circuit comprising:
a distributed summing line; and
a plurality of summing blocks distributed along the summing line, each summing block including at least three ports having an input port, an output port and at least one signal port, wherein a signal applied to each signal port of the summing blocks is modified in amplitude by the summing block and summed with signals propagating along the summing line that are input to the input port and output from the output port of each summing block to provide a combined signal.

2. The circuit according to claim 1 wherein the impedance at each of the ports of the summing blocks is the same.

3. The circuit according to claim 1 further comprising a plurality of summing line attenuators where a separate attenuator is positioned between summing blocks in the summing line for attenuating the combined signal.

4. The circuit according to claim 1 further comprising a plurality of attenuators at the signal ports that attenuate the signal applied to the signal port of the summing blocks.

5. The circuit according to claim 1 wherein each of the summing blocks includes a plurality of resistors defining a resistor divider network.

6. The circuit according to claim 5 wherein the plurality of resistors is three resistors configured in a Tee circuit where each resistor is electrically coupled to the other resistors and one of the ports.

7. The circuit according to claim 1 where the circuit is part of a digital-to-analog converter, said circuit further including a signal line and a plurality of multipliers, wherein a digital bit is applied to each multiplier and multiplied to a signal on the signal line to provide a multiplied signal where the multiplied signal is applied to the signal port of a summing block.

8. The circuit according to claim 7 further comprising a clock line and a reclocking device, said digital bit for each summing block being applied to the reclocking device along with a clock signal on the clock line to provide a clocked bit.

9. The circuit according to claim 1 wherein the summing blocks include four ports and six resistors, and wherein the at least one signal port is two signal ports.

10. The circuit according to claim 9 wherein the circuit is part of a quadrature amplitude modulation modulator including an in-phase portion and a quadrature phase portion, wherein in-phase signals are applied to one of the signal ports and quadrature phase signals are applied to the other signal port of the summing blocks.

11. The circuit according to claim 10 wherein the in-phase portion includes an in-phase multiplier for each summing block and the quadrature phase portion includes a quadrature phase multiplier for each summing block, said in-phase multipliers receiving an in-phase local oscillator signal and an in-phase signal and providing a multiplied in-phase signal to the one signal port of the summing block and said quadrature phase multipliers receiving a quadrature phase local oscillator signal and an quadrature phase signal and providing a multiplied quadrature phase signal to the other signal port of the summing block.

12. The circuit according to claim 11 wherein the in-phase portion includes a plurality of in-phase reclocking circuits that receive the in-phase signals and an in-phase clocking signal and outputs a clocked in-phase signal to the in-phase multiplier for each summing block, and the quadrature phase portion includes a plurality of quadrature phase reclocking circuits that receive a quadrature phase clocking signal and the quadrature phase signals and outputs a clocked quadrature phase signal to the quadrature phase multipliers for each summing block.

13. The circuit according to claim 1 wherein the distributed summing line and the plurality of summing blocks are fabricated on a single integrated circuit.

14. A digital-to-analog converter comprising:
a distributed summing line; and
a plurality of summing blocks distributed along the distributed summing line, each summing block including three resistors defining a resistor divider network and three ports including an input port, an output port and a signal port, wherein a digital bit applied to each signal port of the summing blocks is modified by the summing block and summed with signals propagating along the summing line that are input to the input port and output to the output port of each summing block to provide an analog signal at an output of the summing line.

15. The digital-to-analog converter according to claim 14 further including a signal line and a plurality of multipliers, wherein a digital bit is applied to each multiplier and multiplied to a signal on the signal line to provide a multiplied signal where the multiplied signal is provided to the signal port of a summing block.

16. The digital-to-analog converter according to claim 15 further comprising a clock line and a reclocking device, said digital bit for each summing block being applied to the reclocking device along with the clock signal on the clock line to provide a clocked bit.

17. A modulator comprising:
a distributed summing line;
an in-phase portion providing in-phase signals;
a quadrature phase portion providing quadrature phase signals; and
a plurality of summing blocks distributed along the summing line, each summing block including six resistors defining a resistor divider network and four ports including an in-phase port, a quadrature phase port, an input port and an output port, wherein an in-phase signal is provided to the in-phase port of each summing block and a quadrature phase signal is provided to the quadrature phase port of each summing block, and wherein the in-phase signals and the quadrature phase signals are combined onto the summing line.

18. The modulator according to claim 17 wherein the in-phase portion includes an in-phase multiplier for each summing block and the quadrature phase portion includes a quadrature phase multiplier for each summing block, said in-phase multipliers receiving an in-phase local oscillator signal and the in-phase signals and providing a multiplied in-phase signal to the in-phase port of the summing blocks and said quadrature phase multipliers receiving a quadrature phase local oscillator signal and the quadrature phase signals and providing a multiplied quadrature phase signal to the quadrature phase port of the summing blocks.

19. The circuit according to claim 18 wherein the in-phase portion includes a plurality of in-phase reclocking circuits that receive the in-phase signals and an in-phase clocking signal and outputs a clocked in-phase signal to the in-phase multiplier for each summing block and the quadrature phase portion includes a plurality of quadrature phase reclocking circuit that receive a quadrature phase clocking signal and the quadrature phase signals and outputs a clocked quadrature phase signal to the quadrature phase multiplier for each summing block.

20. The modulator according to claim 17 wherein the impedance at each of the ports of the summing blocks is the same.

* * * * *